United States Patent [19]
Todd et al.

[11] Patent Number: 6,146,608
[45] Date of Patent: Nov. 14, 2000

[54] STABLE HYDRIDE SOURCE COMPOSITIONS FOR MANUFACTURE OF SEMICONDUCTOR DEVICES AND STRUCTURES

[75] Inventors: Michael A. Todd, Danbury; Thomas H. Baum, New Fairfield; Gautam Bhandari, Danbury, all of Conn.

[73] Assignee: Advanced Technology Materials, Inc., Danbury, Mich.

[21] Appl. No.: 08/977,225

[22] Filed: Nov. 24, 1997

[51] Int. Cl.⁷ .............................. C01B 4/00; C01B 6/00; C07F 9/90

[52] U.S. Cl. ...................... 423/249; 423/645; 423/647.7; 427/250; 427/252; 427/531; 427/576; 427/585; 556/46; 556/52; 556/58; 556/70; 556/87; 556/112; 556/121; 556/136; 556/140; 556/170

[58] Field of Search .................................... 423/472, 645, 423/647.7, 249; 556/70, 46, 52, 58, 87, 112, 121, 136, 140, 170

[56] References Cited

U.S. PATENT DOCUMENTS

| | | | |
|---|---|---|---|
| 4,960,916 | 10/1990 | Pazik | 556/70 |
| 5,156,827 | 10/1992 | Tom et al. | 423/299 |
| 5,371,257 | 12/1994 | Gedridge, Jr. | 556/70 |

OTHER PUBLICATIONS

Chemical Abstracts 71:54404.
Chemical Abstracts 69:6762.
Chemical Abstracts 76:8378.
Chemical Abstracts 119:213122.
Grant & Hackh's *Chemical Dictionary*, Fifth Edition (1987), McGraw–Hill Book Company, p. 598.
Database CAPLUS on STN, Chem Abstracts, (Columbus OH, USA) No. 129:237793, Todd, M. et al. "Novel antimony precursors for low–temperature CVD of antimonide thin films." Mater. Res. Soc. Symp. Proc. Abstract. Apr. 1998, vol. 495, pp 113–118.
Database CAPLUS on STN, Chem Abstract (Columbus OH, USA) No. 89:15388, Sugiura, H. "A method of silicon vacuum deposition combined with antimony ion implantation." Skinku. Abstract, Mar. 1978, 21(3), pp 80–85.
Database CAPLUS on STN, Chem Abstract (Columbus OH, USA) No.113:96673, Naumann, D. et al. "Trifluoromethylation of furan, thiopene, pyrrole, and p–benzoquinone with CF3I, Te(CF3) 2, Sb (CF3) 3, Hg (CF3) 2, and Cd (CF3) 2.cntdot.D." J. Fluorine Chem. (1990), 46(2), pp 265–81.
Database CAPLUS on STN, Chem Abstract (Columbus OH, USA) No 113:114384, Huang, Y., et al. "Catalysts for alkenylation of aldehydes and their application." Faming Zhuanli Shenqing Gongkai Shuomingshu, 12 pp.
Molnár, J., et al., "Molecular Structure of $SbI_3$ and $BiI_3$ from Combined Electron Diffractionand Vibrational Spectroscopic Studies," Inorg. Chem. 1996, 35, pp. 7639–7642.
Todd, M.A., et al., "Novel Antimony Precursors for Low––Temperature CVD of Antimonide Thin Films," Submitted at MRS Proceedings, Dec. 5, 1997.
Naumann, D., et al., "Polar trifluoromethylation reactions. Synthesis and NMR spectra of tris(trifluoromethyl)antimony, $Sb(CF_3)_3$," Journal of Organometallic Chemistry, 333 (1987) pp. 193–197.

(List continued on next page.)

*Primary Examiner*—Wayne Langel
*Attorney, Agent, or Firm*—Steven J. Hultquist

[57] ABSTRACT

A metal hydride derivative wherein at least one hydrogen atom is replaced by deuterium ($^2_1H$) or tritium ($^3_1H$) isotope. The metal constituent of such metal hydride may be a Group III, IV or V metal or a transition metal, e.g., antimony, aluminum, gallium, tin, or germanium. The isotopically stabilized metal hydride derivatives of the invention are useful as metal source compositions for chemical vapor deposition, assisted chemical vapor deposition (e.g., laser-assisted chemical vapor deposition, light-assisted chemical vapor deposition, plasma-assisted chemical vapor deposition and ion-assisted chemical vapor deposition), ion implantation, molecular beam epitaxy, and rapid thermal processing.

15 Claims, 4 Drawing Sheets

OTHER PUBLICATIONS

Oleszek, G.M., et al., "Sb Implantation for Bipolar Buried Layers Using SbF$_5$ in a Cold–Cathode Implantation System," Nuclear Instruments and Method in Physics Research B6 (1985) pp. 389–393.

Wardell, J.L., "Arsenic, Antimony and Bismuth," University of Aberdeen, pp. 681–707.

Von Gerhart Jander, et al., "Geschmolzenes Antimon (III)–Bromid Als Ionisierendes Lösungsmittel Und Das Verhalten Darin Gelöster Substanzen.I," Aus dem Anorganisch–Chemischen Institut der Technischen Universität Berlin–Charlottenburg (Eingegangen am 29. Juli 1957), pp. 1275–1283.

Cao, D. S., et al., "Decomposition Studies of Tetiarybutyldimethylantimony,"Solid–State Electronics Laboratory (1991) pp. 583–588.

Dale, J. W., et al., "Organometallic and Organometalloidal Fluorine Compounds. Part XIII Trifluoromethyl Derivatives of Antimony," Presented at American chemical Society Meeting, New York, 1954, pp. 3708–3713.

Bigeleisen, J., et al., "Calculation of Equilibrium Constants for Isotopic Exchange Reactions," The Journal of Chemical Physics, vol. 15, No. 5, May 1947, pp. 261–267.

Breunig, H. J., et al., "Strukturen und Reaktionen von Methylantimondihalogeniden und Versuche zur Darstellung von Methylantimon," Journal of Organometallic Chemistry, 470 (1994) 87–92, pp. 87–92.

Sugiura, O., et al., "Low–Temperature Growth of InSb by Vacuum MOCVD Using TeIn and SbH$_3$," Journal of Electronic Materials, vol. 17, No. 1, 1988, pp. 11–14.

Romig, T., et al., "Advances in Ion Implanter Productivity and Safety," Solid State Technology, Dec. 1996, pp. 69–74.

Hendershot, D. G., et al., "Synthesis, Characterization, and Chemical Vapor Deposition Properties of Primary and Secondary Neopentylstibine. New Antimony Precursors for MOCVD," Chem. Mater. 1992, 4, 883–837.

Halonen, M., et al., "Local–Mode Effects on the Rotational Structure of the First Stretching Overtone Band System of Stibine, SbH$_3$," J. Chemical Phys., 95(10), Nov. 15, 1991, pp. 7099–7107.

Hendershot, D. G., et al., "Primary and Secondary Trimethylsilylmethylstibines. Synthesis, Characterization and Chemical Vapor Depostion Properties," Journal of Organometallic Chemistry, 119 (1993) pp. 119–123.

Bailar, Jr., J. C., et al., "Antimony Triiodide," Inorganic Syntheses, pp. 104–105.

6,146,608

STABLE HYDRIDE SOURCE COMPOSITIONS FOR MANUFACTURE OF SEMICONDUCTOR DEVICES AND STRUCTURES

CROSS-REFERENCE TO RELATED APPLICATION

U.S. patent application Ser. No. 08/977,507, now U.S. Pat. No. 6,005,127, in the names of Michael A. Todd, Thomas H. Baum and Gautam Bhandari for "Antimony/Lewis Base Adducts for Sb-Ion Implantation and Formation of Antimonide Films" is being co-filed herewith on Nov. 24, 1997.

BACKGROUND OF THE INVENTION

1. Field of the Invention

This invention relates to the stabilization of hydrides and other compositions in which deuterium and/or tritium may be substituted to derivatize the hydride composition and produce a highly stabilized deutero- and/or tritiato-species. In a particular aspect, the invention relates to reagents useful as metal source compositions for ion implantation, chemical vapor deposition, laser or light-induced deposition, plasma-induced or ion beam-induced deposition, or other metal formation processes, in which the metal source compositions have been stabilized by the incorporation of deuterium and/or tritium substituents therein.

2. Description of the Related Art

In the fabrication of advanced semiconductor devices, processes such as III–V MOCVD and p/n doping by ion implantation ideally require the use of Group III and Group V hydrides.

However, the hydrides of the heavier elements of Group III and Group V are unstable or in some cases are simply not known. For instance, stibine is only stable at very low temperatures (–78° C.), decomposing spontaneously at room temperature, while indane cannot be isolated.

In addition, alkyl or aryl metal hydrides such as $HSbR_2$ and $H_2SbR$, wherein R is alkyl, are also unstable.

Although literature reports indicate that researchers have synthesized and used metal hydrides as precursors when stored at low temperatures, widespread commercialization has not been possible due to the limited stability of the hydrides to light, heat and metal surfaces (i.e., stainless steel).

Sophisticated microelectronic components and device heterostructures are driving the development of CVD precursors that exhibit useful volatility and the ability to deposit high-purity films. Currently, many III–V devices based upon strained layer superlattices and multiple quantum wells (MQW) are fabricated by molecular beam epitaxy (MBE). MBE is relatively slow and expensive when compared to alternate thin-film growth techniques used for microelectronics.

Although chemical vapor deposition (CVD) offers a low-cost, high throughput approach to device manufacturing, a lack of suitable, low temperature CVD precursors has hindered its widespread applicability. This is particularly true for Sb-based heterostructures that display important opto-electronic and electronic properties, including InSb, InGaSb, InAsSb, GaAlSb and InSbBi. Volatile and thermally stable Sb precursors would facilitate the chemical vapor deposition of antimonide thin-films, as required for the large scale, controlled production of antimonide based lasers, detectors and microelectronic sensors.

Antimonide materials are attractive for commercial infrared optoelectronic applications. The compositional variety and stoichiometry of III–V compound semiconductors allows for nearly complete coverage of the infrared spectrum. Bandgaps ranging from 2.5 eV in AlP to 0.2 eV in InSb can be achieved by forming strained thin-films with the proper elemental and stoichiometric compositions. Materials of greatest interest include InSbBi and Inas-SbBi$_8$ for long wavelength (8–12 mm) infrared detectors, InAsSb and InGaSb1° for mid-infrared absorbers in military applications, and $InSb/In_{1-x}Al_xSb_{11}$ light emitting diodes (LEDs) for mid-infrared chemical sensor applications. Many of these materials, however, as mentioned above are meta-stable compositions that necessitate high-purity films and low processing temperatures.

Antimonides are also of great interest as semiconductor infrared lasers. For instance, a type-II quantum well superlattice laser, comprised of InAsSb active layer with alternating InPSb and AlAsSb cladding layers, provides 3.5 mm emission upon electron injection. Similarly, mid-infrared lasers comprised of InAs/InGaSb/InAs active regions with lattice-matching to AlSb cladding layers were also demonstrated. The device fabrication requires thin-film processing of elemental aluminum, antimony, gallium and indium to produce both the active and cladding layers, and thereby, presents a significant technological challenge. The inherent physical properties of Ga, Sb and In necessitate low processing temperatures to alleviate inter-diffusion, melting, and re-evaporation (i.e., InSb melts at 525° C.). Unfortunately, current Sb CVD sources, such as trimethyl antimony, require processing temperatures in excess of 460° C. to achieve precursor decomposition and useful film growth rates.

SUMMARY OF THE INVENTION

The present invention relates to the substitution of deuterium and/or tritium atoms in place of hydrogen atoms in metal hydrides to yield deutero- and/or tritiato-metal compounds. Substitution of the hydrogen atoms by deuterium and/or tritium enables the stabilization of some unstable hydrides, including all antimony trihydrides (e.g., stibine, $SbH_3$) or substituted dihydrides of antimony.

This stabilization improvement is attributable to the hydrogen isotope effect. This effect involves lowering of the ground electronic state (zero point energy) of the deuterium and/or tritium analog compared to the non-deuterated compound. By lowering the ground state, the deuterated and/or tritiated compound is much more stable, i.e., less reactive, than its proteo analog. The theoretical value of $k_H/k_D$ is approximately 6.5 for reactions involving C—H bonds. When hydrogen atoms are attached to the heavier elements such as transition metals, this value is frequently much greater than 6.5. Such increase of $k_H/k_D$ is attributable to the phenomenon of quantum mechanical tunneling, whereby the height of the activation barrier is effectively lowered due to the ability of the lighter isotope (in this case hydrogen) to tunnel across the barrier of potential energy surface.

In one aspect, the present invention relates to complexes of the type $$D_xMR_y$$

where:
 each D is independently selected from deuterium ($^2_1H$) and tritium ($^3_1H$) isotope;
 M is a metal selected from the group consisting of Group III, IV or V metals and transition metals;

each R is independently selected from $C_1$–$C_8$ alkyl, $C_1$–$C_8$ perfluoroalkyl, $C_1$–$C_8$ haloalkyl, $C_6$–$C_{10}$ aryl, $C_6$–$C_{10}$ perfluoroaryl, $C_6$–$C_{10}$ haloaryl, $C_6$–$C_{10}$ cycloalkyl, substituted $C_6$–$C_{10}$ aryl and halo; and x and y are each independently from 0 to 6 inclusive.

When R is substituted $C_6$–$C_{10}$ aryl, the substituents may be independently selected, inter alia, from $C_1$–$C_8$ alkyl, $C_1$–$C_8$ haloalkyl, and halo.

In instances where the cost is not a factor, such as in ion implant applications, tritium may be used instead of deuterium to realize even greater stability than is achievable by the deuterium substitution of the complex.

Another aspect of the invention relates to a metal hydride derivative wherein at least one hydrogen atom is replaced by deuterium ($^2_1H$) or tritium ($^3_1H$) isotope. The metal hydride's metal constituent is selected from Group III, IV and V metals and transition metals and may for example comprise antimony, aluminum, gallium, tin, germanium, or indium.

The metal hydride of the invention may have the formula $MY_n$ wherein M is an n-valent metal, each Y is independently selected from hydrogen, deuterium ($^2_1H$) isotope, atritium ($^3_1H$) isotope, and halo, n is at least 2, with the proviso that at least one Y constituent is either deuterium (2 1H) isotope or tritium ($^3_1H$).

In such metal hydride, n may be from two to six, inclusive.

Another aspect of the invention relates to metal hydride derivatives of the formula:

$$D_xMR_y$$

wherein:

M is a z-valent metal selected from Group III, IV and V metals and transition metals;

each D is independently selected from hydrogen, deuterium ($^2_1H$) isotope and tritium ($^3_1H$) isotope;

each R is independently selected from alkyl, $C_1$–$C_8$ alkyl, $C_1$–$C_8$ perfluoroalkyl, $C_1$–$C_8$ haloalkyl, $C_6$–$C_{10}$ aryl, $C_6$–$C_{10}$ perfluoroaryl, $C_6$–$C_{10}$ haloaryl, $C_6$–$C_{10}$ cycloalkyl, substituted $C_6$–$C_{10}$ aryl and halo;

x is at least one;

x+y z;

with the proviso at least one D is either deuterium ($^2_1H$) isotope or tritium ($^3_1H$) isotope.

The invention in a further aspect relates to deuterated stibine, $Sb(^2_1H)_3$, deuterated deuterated tin, $Sn(^2_1H)_4$, deuterated gallium, $Ga(^2_1H)_3$, deuterated germanium, $Ge(^2_1H)_4$, and deuterated aluminum, $Al(^2_1H)_3$ or $Al(^2_1H)_3 \cdot L$, where L is a Lewis base. Such Lewis base may be of any suitable species, e.g., glymes, tetraglymes, polyamines, etc.

The metal deuterides and tritiides of the invention have utility as precursors for ion implantation, as well as for chemical vapor deposition (CVD), or beam-induced CVD (e.g., laser, light, plasma, ion, etc.).

In yet another aspect of the invention, there is provided a non-aqueous method of making a metal hydride derivative at least one of whose hydrogen atoms is replaced by a deuterium ($^2_1H$) isotope or a tritium ($^3_1H$) isotope, comprising reacting a metal halide compound whose metal moiety is the same metal as the metal of the metal hydride product, with a metal hydride reactant of the formula:

$$M_1M_2D_a$$

wherein $M_1$ is selected from the group consisting of lithium, sodium and potassium;

$M_2$ is selected from the group consisting of aluminum, gallium and boron; and each D is independently selected from the group consisting of hydrogen, deuterium ($^2_1H$) isotope and tritium ($^3_1H$) isotope, with the proviso that at least one D is deuterium or tritium isotope.

The above-described reaction of the metal halide compound and metal hydride reactant is advantageously carried out in a reaction volume including a solvent such as etheric solvents, glycols and/or polyamines.

In another aspect, the invention relates to a method of depositing a metal M from a metal-containing precursor therefor, comprising using as a precursor a metal hydride derivative wherein at least one hydrogen atom is replaced by deuterium ($^2_1H$) isotope or tritium ($^3_1H$) isotope.

In such method, the metal may be deposited by a process selected from the group consisting of chemical vapor deposition, assisted chemical vapor deposition (e.g., laser, light, plasma, ion, etc.), ion implantation, molecular beam epitaxy, and rapid thermal processing.

Still another aspect of the invention relates to a storage and dispensing system for a metal hydride gas, comprising:

a vessel containing (1) a sorbent material having sorptive affinity for the metal hydride gas and (2) metal hydride gas;

wherein the metal hydride gas comprises a metal hydride derivative wherein at least one hydrogen atom is replaced by deuterium ($^2_1H$) or tritium ($^3_1H$) isotope.

In such storage and dispensing system, the sorbent material may suitably comprise a solid physisorbent material. Alternatively, the sorbent material may comprise a liquid sorbent in which the metal hydride gas is soluble, such as polyethers, glycols, cryptanes and crown ethers.

Other aspects, features and advantages of the present invention will be more fully apparent from the ensuing disclosure and appended claims.

DETAILED DESCRIPTION OF THE INVENTION, AND PREFERRED EMBODIMENTS THEREOF

Figure 1:
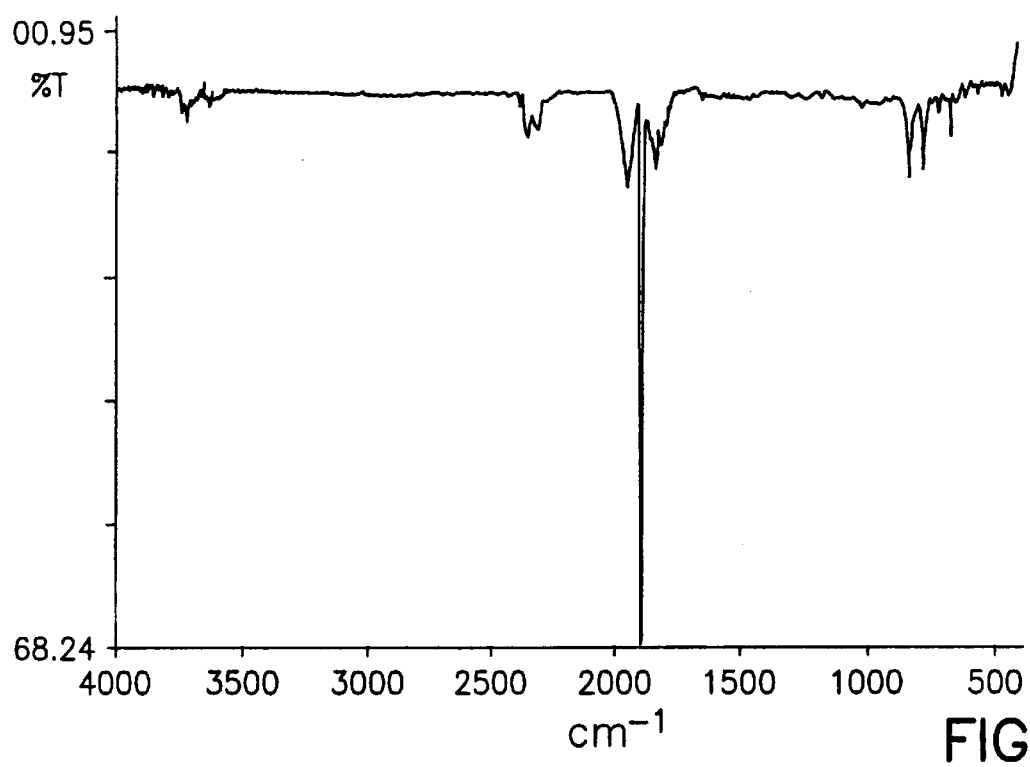
FIG. 1 shows a spectrum of SbH3/impurity gas mixture immediately after synthesis and isolation, in which the Sb-H stretch at 1885 cm-1 is clearly visible as the strongest absorption in the spectrum.

The present invention is based on the discovery that metal hydride species which are inherently unstable at ambient temperature conditions can be stabilized via deuteration and/or tritiation thereof.

An illustrative example is stibine trideuteride, SbD3, which in its fully hydridic form, SbH3, is unstable and therefore unavailable as a precursor material for antimony at room temperature in uses such as ion implantation, chemical vapor deposition, etc.

SbD3 offers the possiblity of being the ultimate antimony source for ion implantation and chemical vapor deposition (CVD) and beam-induced applications due to its volatility and its lack of potential contaminant elements.

Such SbD3 antimony source may be provided in a preferred form as a sorbate which is sorptively retained on a suitable sorbent medium in a storage and dispensing vessel holding the physical sorbent and the SbD3 antimony source material, in accordance with the disclosure of U.S. Pat. No. 5,518,528 issued May 21, 1996 in the names of Glenn M. Tom and James V. McManus. The storage and dispensing vessel is equipped with suitable dispensing means such as a conventional valve head assembly, to provide on-demand dispensing of the storage antimony source gas. Such storage approach enables a new and valuable antimony source for commercialization. SbH3 is too thermally unstable to serve as such a source, with thermal decomposition into antimony (metal) and hydrogen gas being observed during room temperature storage.

While the invention is discussed herein primarily in terms of stibine trideuteride, it will be recognized that the utility of the invention is not thus limited, but rather extends to and encompasses other metals which are amenable to deuteration or tritiation. Examples include Group III, IV and V metals and transition metals. Because the present invention facilitates a long-sought antimony source material, the following discussion will be directed primarily to deuterides and tritiates of such metal, it being recognized that the invention is broadly applicable to a wide variety of other metals having stable as well as unstable hydride forms. Even where the metal hydride per se is stable, e.g., at ambient temperature and pressure conditions, it may be desirable to utilize the deuterated and/or tritiated forms of such compounds, to realize even higher stability, as may be advantageous for example for storage and transport of such derivatives of other metals.

$SbD_3$ has superior stability relative to $SbH_3$, and at sufficiently low storage pressures, no detectable decomposition of the molecule occurs (e.g., during room temperature storage for six days). By contrast, $SbH_3$ which was stored in a hexamethyldisilazane-passivated glass container began to show signs of decomposition after storage for two days at room temperature and was completely decomposed by the third day.

The synthesis of stibine and deutero-stibine may be effected via a novel reaction route which employs a non-aqueous reaction medium and common reducing agents, by the illustrative non-aqueous reactions shown in equations 1–4 below:

(1) $SbX_3$ + $LiAlH_4$ $\xrightarrow{\text{tetraglyme}}$ $SbH_3$ (g)

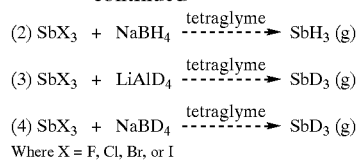

Where X = F, Cl, Br, or I

Yields approaching 70% are readily obtainable in these reactions. The materials which were collected tend to be much purer for the $LiAlH_4$ and $LiAlD_4$ reactions, due to the formation of borohydrides and borodeuterides in the reactions described in equations 2 and 4. These borohydrides and borodeuterides can easily be separated from the stibine(s) (2) and the deuterated Sb compound (4).

Illustrative data showing the stability of $SbD_3$ relative to $SbH_3$ were obtained, and are discussed below.

Figure 2:
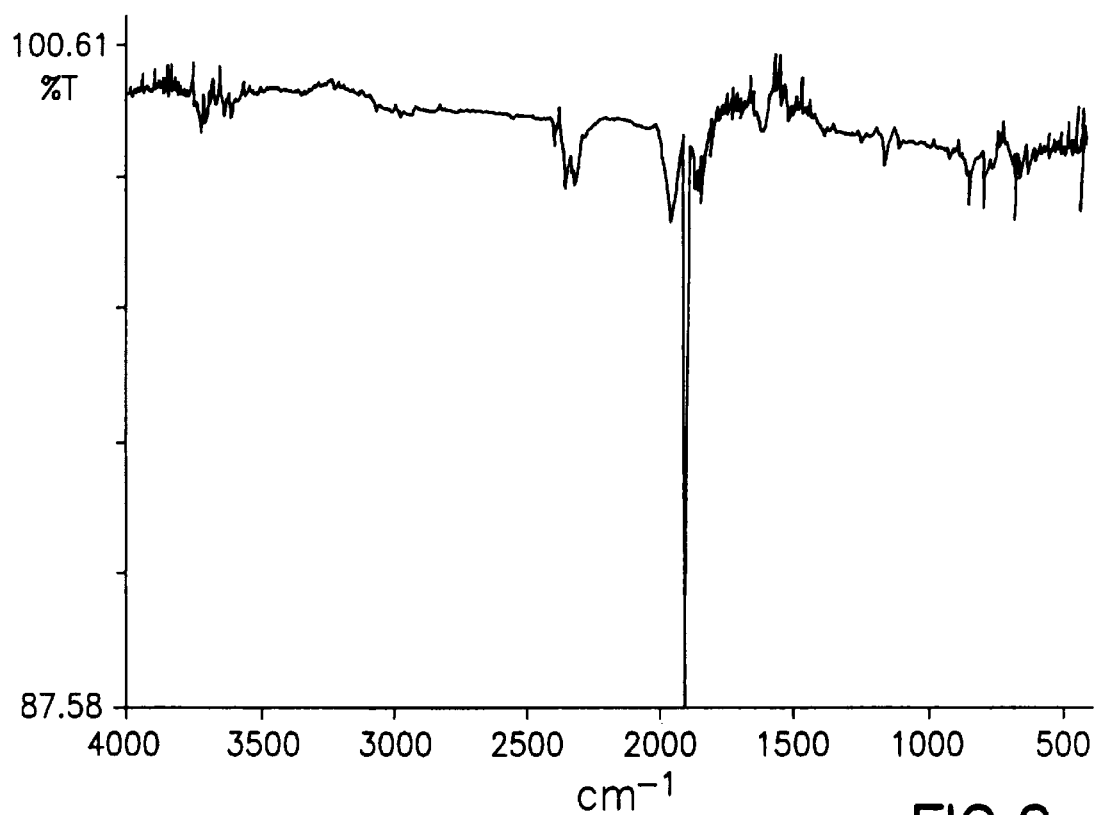
FIG. 2 shows a spectrum of stibine and a synthetic impurity after 1 day of storage at room temperature, in which the relative intensity of the Sb-H stretch (1890 cm$^{-1}$) as compared to the impurity stretch observed at ~2300 cm–1 reveals that there is less stibine present in the gas mixture.

Gas phase FTIR spectra were generated for $SbH_3$ which was stored at approximately 10 Torr vapor pressure in a glass container which had been surface passivated using 1,1,1-3,3,3-hexamethyldisilizane. FIG. 1 is the spectrum of the volatiles collected immediately after the reaction. It reveals the presence of $SbH_3$, with strong Sb-H stretching centered at 1885 cm−1 (a volatile impurity is observed with stretching at ~2300 cm$^{-1}$). This spectrum serves as the baseline for comparison of the FTIR spectra shown in FIGS. 2 and 3.

Figure 4:
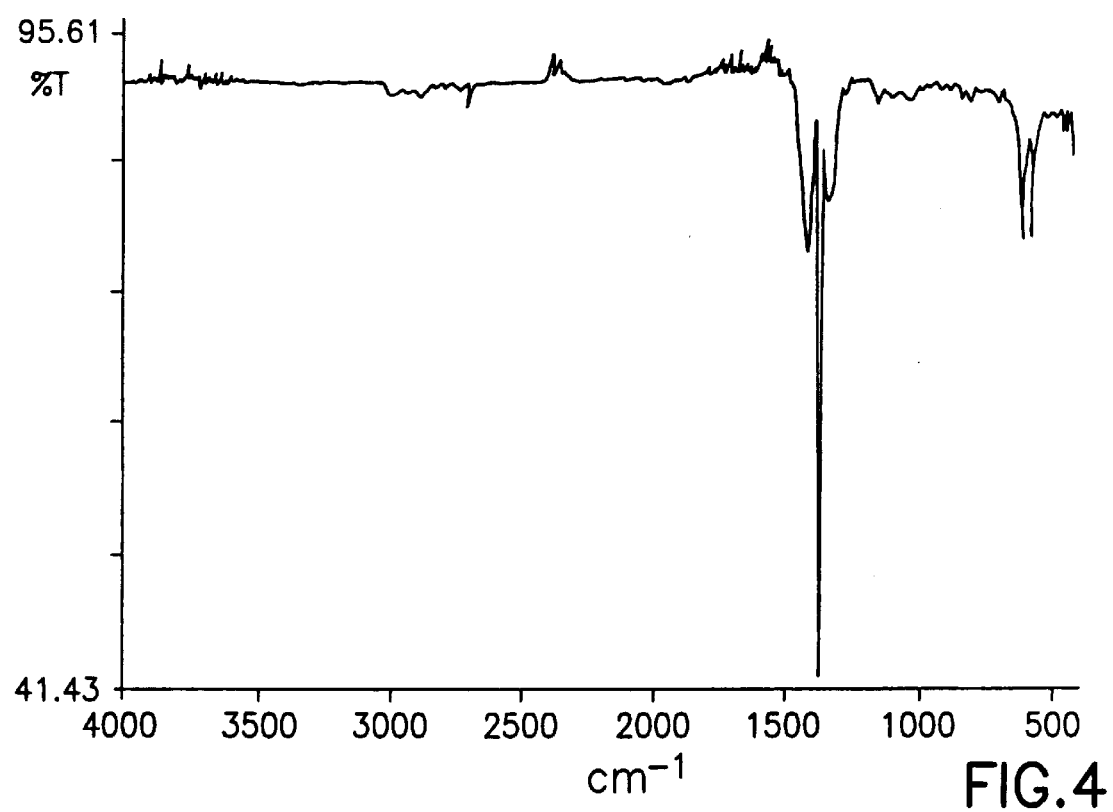
FIG. 4 shows a gas phase FTIR of $SbD_3$ immediately after synthesis, in which the Sb-D stretch, located at 1362 cm–1 is shifted nearly 530 cm–1 from the Sb-H stretch observed in stibine.

FIG. 4 is the spectrum for the volatiles in the container, after degassing at −196° C., after one day of storage at room temperature. Of note in the spectrum is the decrease in the relative intensity of the Sb-H stretch (1885) when compared to the stretch observed at ~2300 cm−1. This decrease in intensity indicates that $SbH_3$ begins to decompose during 24 hours of storage at room temperature. Even this limited stability is still an improvement over stibine, which when stored in untreated glassware, exhibits signs of decomposition immediately upon warming to room temperature.

Figure 3:
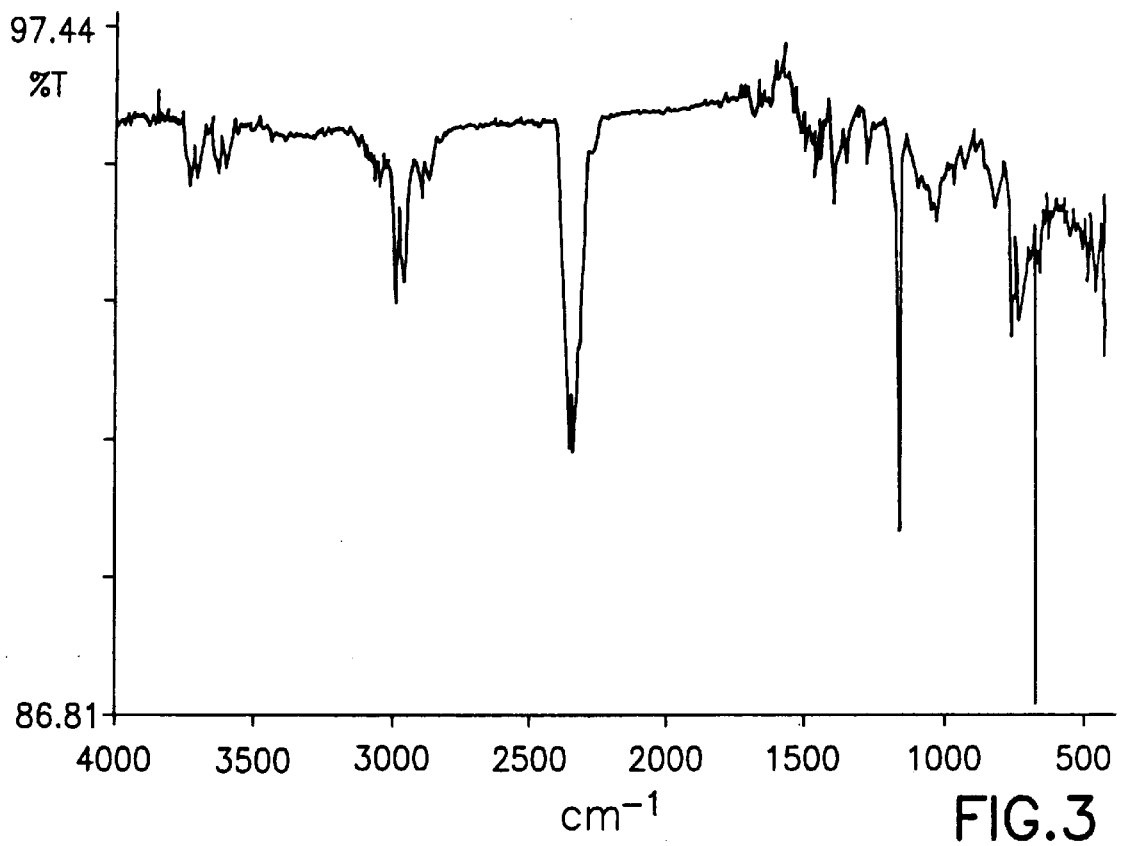
FIG. 3 shows an FTIR spectrum of volatiles in a storage container after complete decomposition of stibine into $H_2$ and Sb (m), as evidenced by the complete disappearance of the Sb-H stretch at 1890 cm$^{-1}$.

FIG. 3 shows the volatile components left in the storage container after degassing at −196° C. Clearly, all of the stibine has decomposed by this point (~3 days at room temperature), as there is no longer Sb-H stretching visible at 1885 cm−1.

A second set of gas phase FTIR spectra was obtained for the volatile components of a completely untreated glass container used to store $SbD_3$. The gas was stored at ~10 Torr pressure at room temperature for six days with no noticeable signs of decomposition. In each case, the only observable species corresponds to $SbD_3$ (with Sb-D stretching observed at 1362 cm−1) and a very small quantity of $SbH_3$ (present from the fact that deuterated reagents are typically not 100% deuterated, but also contain a small fraction of H) as evidenced by the stretch at 1885 cm−1.

Figure 5:
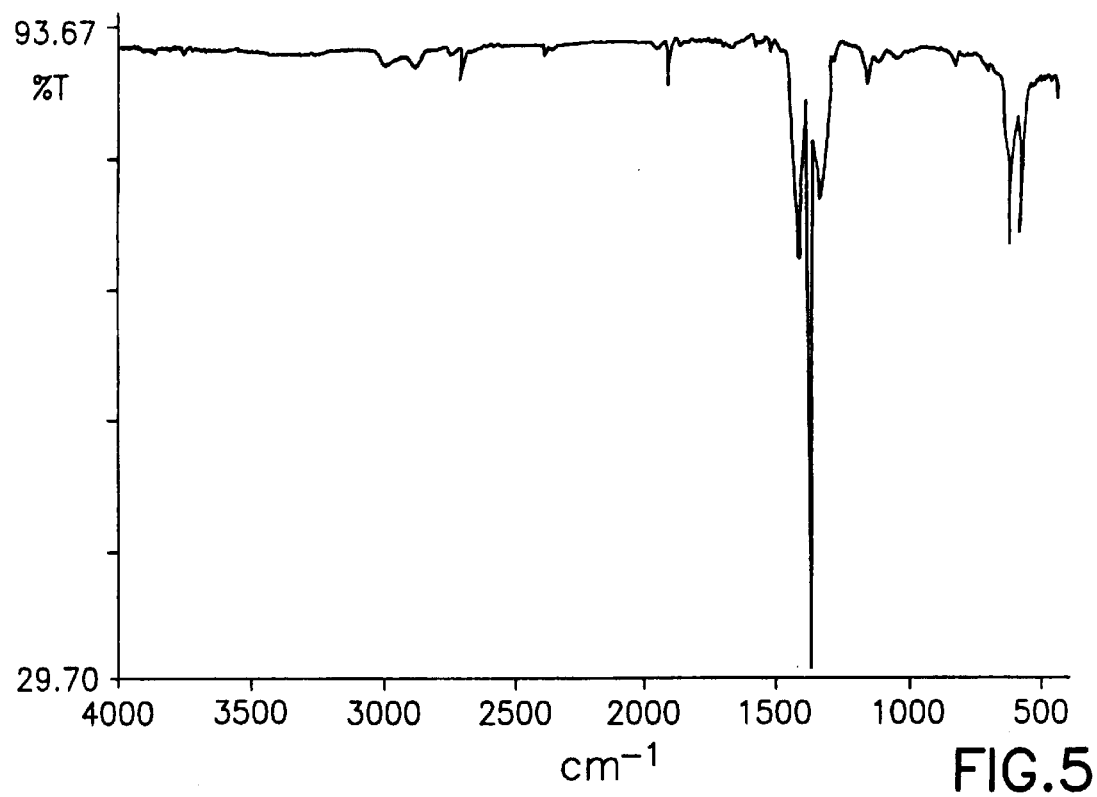
FIG. 5 shows a gas phase FTIR spectrum of volatile components in a $SbD_3$ storage container after 3 days of storage at room temperature.
Figure 6:
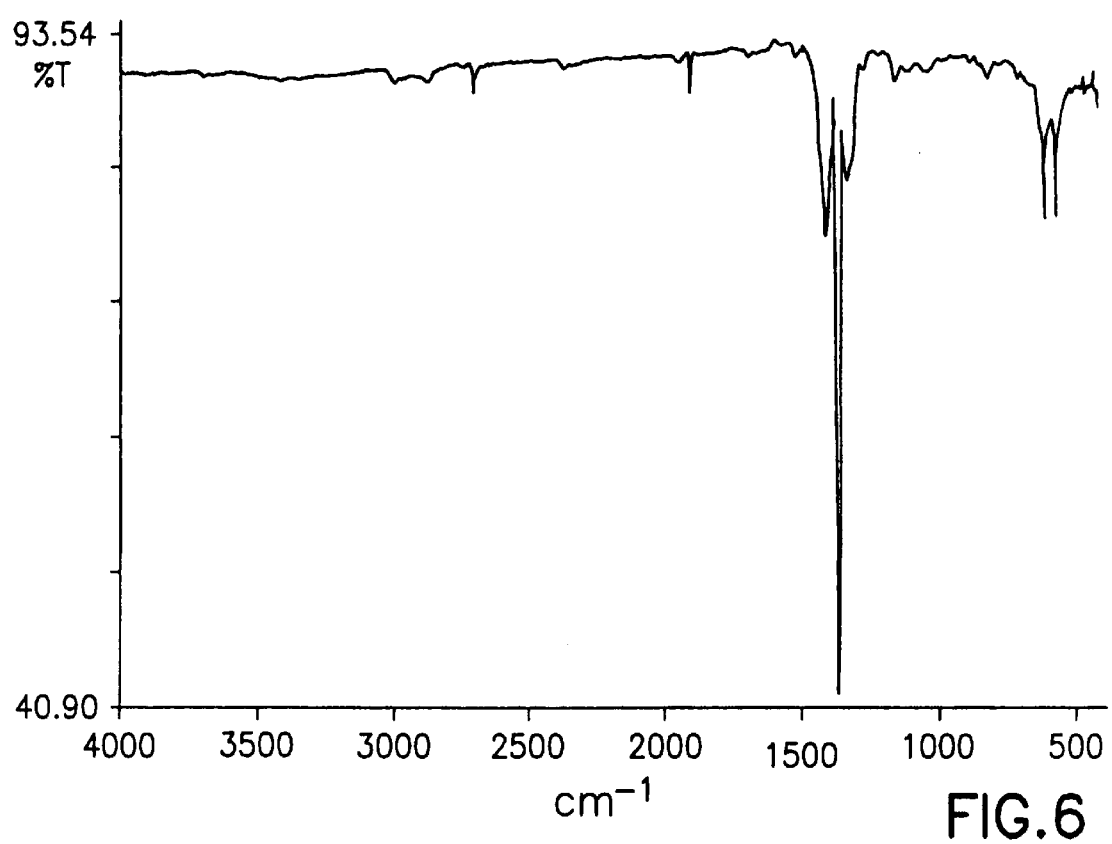
FIG. 6 shows a gas phase FTIR spectrum of volatiles in a $SbD_3$ container after 6 days storage at room temperature, with the $SbD_3$ exhibiting no decomposition at 10 Torr.

The three spectra displayed in FIGS. 4, 5, and 6 correspond to the volatile components of the container (i) after the synthesis of the molecule, (ii) after three days of storage at room temperature and (iii) after six days of storage at room temperature, respectively. In each case, the $SbD_3$ remains unchanged and shows no decrease in intensity (nor did the total pressure of the $SbD_3$ change observably over this time period).

FIG. 4 shows the gas phase FTIR spectra of $SbD_3$ immediately after synthesis. The Sb-D stretch, located at 1355 cm−1 is shifted nearly 530 cm−1 from the Sb-H stretch observed in stibine.

FIG. 5 shows the gas phase FTIR spectrum of volatile components in the $SbD_3$ storage container after 3 days of storage at room temperature.

FIG. 6 shows the gas phase FTIR spectrum of volatiles in $SbD_3$ container after 6 days storage at room temperature. The $SbD_3$ exhibits no decomposition at 10 Torr.

Based on these results it is readily apparent that deuterated stibine is far more stable than its hydride analog. The efficiency of $SbD_3$ as a suitable antimony source for ion implantation and chemical vapor deposition, having superior stability to stibine per se, is demonstrated.

The foregoing illustrates that antimony trihydride (stibine), $SbH_3$, and antimony trideuteride, $SbD_3$, may be synthesized in high yields via the non-aqueous synthetic route of the present invention. The results also illustrate that deuterated stibine displays significantly greater thermal stability than its hydride analog via isotopic stabilization and can be stored for weeks at room temperature with minimal decomposition.

Thermal decomposition of $SbD_3$ was performed at 300° C. in a horizontal, hot-wall CVD reactor. Decomposition efficiencies approaching 50% were achieved when $SbD_3$ was diluted with $H_2$ co-reactant. As this research demonstrates, deuterated stibine is an ideal CVD source due to its gaseous state, compositional simplicity and lack of Sb-C bonds, and its ability to deposit high-purity Sb films at relatively low temperatures.

$SbD_3$ thus provides a precursor molecule that offers carbon-free decomposition at substrate temperatures below 200° C., exhibiting enhanced thermal stability at room temperature relative to its hydride analog and being storable for prolonged periods of time with minimal decomposition.

$SbH_3$ may be synthesized in high yield via reaction of antimony(III) chloride and lithium aluminum hydride in tetraethylene glycol dimethyl ether ("tetraglyme") solvent at −30° C., as depicted in Equation 1. Other reductants, such as NaBH4 and LiH, can also employed for the synthesis of stibine, but LiAlH4 was found to give the highest yields.

The stibine generated from this reaction may be trapped in a cold trap kept at −130 ° C. The use of a high boiling, coordinating solvent, such as tetraglyme (Tb=275° C.), is particularly useful in separating stibine from the reaction mixture.

Deuterated stibine, $SbD_3$ may be readily synthesized by the synthetic procedure described above, after replacing LiAlH4 with LiAlD4. Again, the use of other deuterated reducing agents such as NaBD4 and LiD results in lower yields of $SbD_3$.

The most striking feature of the IR spectrum for SbD3 is its similarity to that of SbH3 in terms of the observed stretching and bending modes. Importantly, however, the energies at which these vibrational modes occur are greatly shifted with respect to those observed in $SbH_3$. The observed energy of the Sb-D stretch is 1362 cm−1. This corresponds to an isotopic shift ($\Delta v$) of nearly 500 cm−1 compared to the Sb-H stretching. The bending modes are observed to shift to lower relative energies when compared to those observed in $SbH_3$. In accordance with Hooke's Law, this spectral shift is due to the reduced mass difference in Sb-D relative to Sb-H.

Quantum mechanical tunneling provides a facile mechanism for the decomposition of many unstable metal hydrides. Deuterium, because of its increased mass, is unable to readily tunnel through the quantum "tunnel". This behavior of "quantum mechanical tunneling" phenomena, whereby the height of the activation energy barrier is effectively increased due to the inability of the heavier isotope (in this case deuterium) to tunnel through the barrier is exploited in accordance with the present invention to stablize stibine and other metal hydrides.

Figure 7:
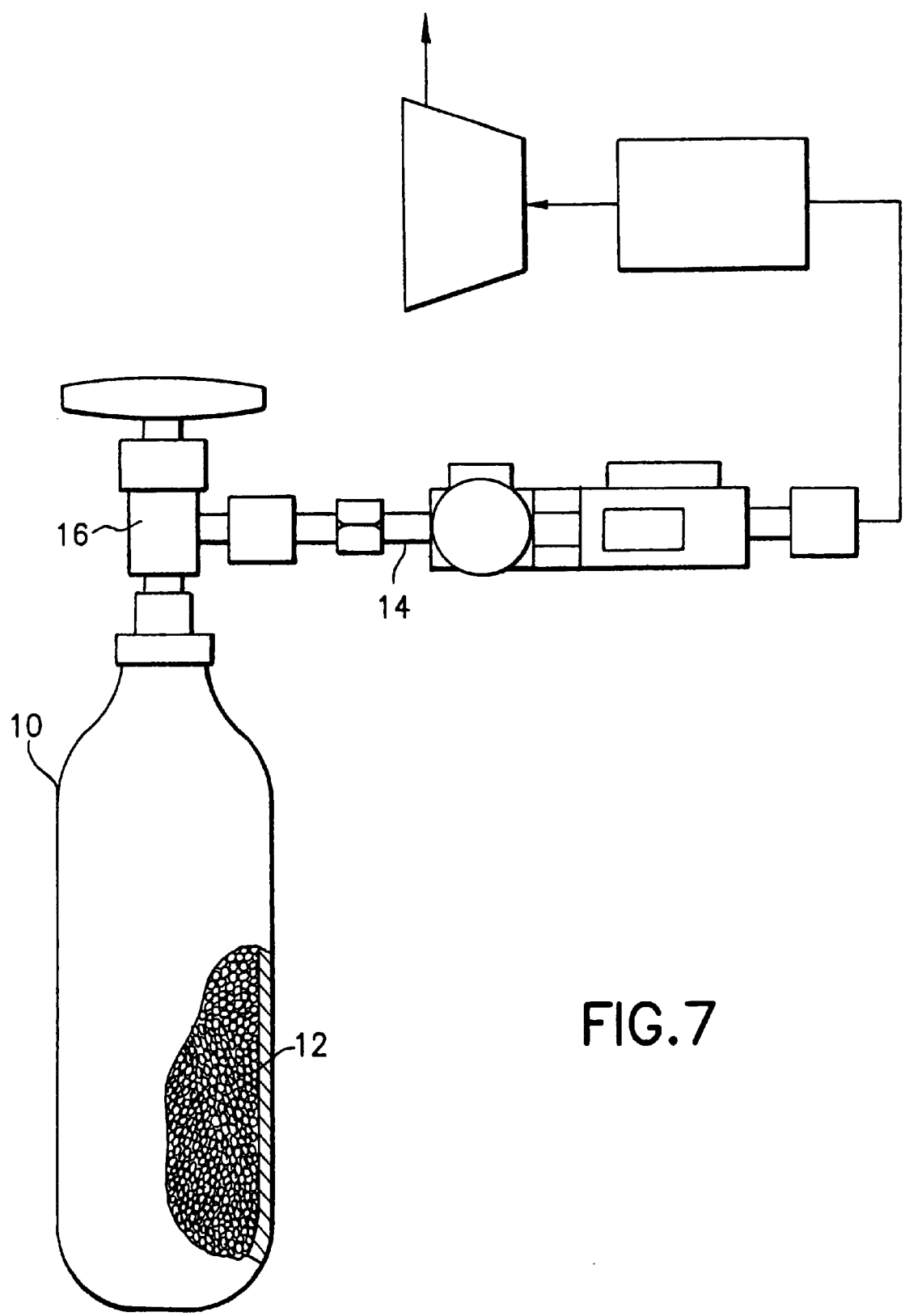
FIG. 7 is a schematic representation of a gas storage and dispensing vessel holding a sorbent medium and a deuterated and/or tritiated sorbate gas according to the invention.

FIG. 7 is a schematic representation of a gas storage and dispensing vessel 10 holding a sorbent medium 12 and a deuterated and/or tritiated sorbate gas according to the invention. The gas storage and dispensing vessel may be constructed and arranged as more fully described in the aforementioned Tom et al. patent, and features a dispensing manifold 14 joined to the valve head 16 of the vessel as illustrated. By the apparatus shown in FIG. 7, the deuterated and/or tritiated metal source reagents of the present invention may be stored for extended periods of time, and supplied on demand for such applications as ion implantation and chemical vapor deposition.

The features and advantages of the invention are more fully shown by the following non-limiting Examples, in which the symbol D in chemical formulae denotes deuterium isotope.

In these Examples the experimental procedures were as follows:

General Procedures: All synthetic work was performed in a nitrogen filled glovebox or under dry nitrogen using standard vacuum-line and Schlenk techniques. Unless noted otherwise, all chemicals were used as received from the vendor. The FTIR spectra were collected on a Perkin Elmer model 1650 spectrometer. Nuclear magnetic resonance spectra were recorded on a Varian Gemini 200 MHz spectrometer.

Thin Film Deposition: The thin films described below were deposited in a horizontal, resistively heated, hot-walled CVD reactor. Temperature control was accomplished using a temperature controller and both reactant and carrier gases were introduced via mass flow controllers. Pumping of the reactor system is accomplished using a liquid nitrogen trapped diffusion pump and provides a base pressure $7\times10^{-5}$ Torr. Processing pressures were monitored via a capacitance manometer (MKS Model) and varied by changing the reactant and carrier gas flow rates. The condensible volatiles of the reactions were collected in a glass trap cooled to −196° C. by liquid nitrogen and were analyzed using FTIR or, when possible, NMR. Analysis of these byproducts in conjunction with analysis of the film properties and compositions allowed for optimization of the processing conditions.

Film Composition. The composition and morphology of the films deposited was investigated using x-ray diffraction (XRD), energy dispersive x-ray analysis (EDS), scanning electron microscopy (SEM) and atomic force microscopy (AFM).

I. Synthesis of $SbH_3$ (1): Stibine was synthesized via an aqueous reaction route and via two novel nonaqueous reaction routes.

Method A: A 500 ml flask was charged with a solution of 12 ml con-centrated sulfuric acid in 100 ml distilled, de-ionized water and cooled to 0° C. A 50 ml aqueous solution of KOH (6 g, 107 mmol), $SbCl_3$ (0.5 g, 2.2 mmol) and NaBH4 (0.42 g, 11 mmol) was prepared by dissolving the reagents, in the order in which they are listed, in 50 ml distilled de-ionized water. The latter solution was then added dropwise, with continuous stirring, to the former over a period of fifteen minutes. During this time, the reaction flask was open to a high vacuum manifold backfilled with 760 Torr of dry nitrogen. The mixture immediately turned a light brown color, which darkened to black very rapidly with continuing addition of the reagents. After approximately one-half of the antimony solution had been added, the reaction flask was opened to vacuum and the volatiles were passed through traps held at −78° C., −130° C. and −196° C., respectively. The −130° C. trap was found to contain $SbH_3$ (0.12 g, 0.96 mmol, 44%).

Method B: A 500 ml flask was charged with a suspension of NaBaH4 (0.43 g, 11 mmol) in 100 ml tetraglyme and cooled to 0° C. A solution of $SbCl_3$ (0.5 g, 2.2 mmol) in 50 ml tetraglyme was prepared in a nitrogen-filled glove box and then placed in an addition funnel. The reaction flask and the addition funnel were then connected using standard Schlenck techniques. These were then degassed by opening them to vacuum. The reaction was begun by slowly adding the antimony solution to the cooled, stirred sodium borohydride suspension. The suspension was observed to turn black with continuing addition of the antimony solution, and the evolution of a gas from the surface of the tetraglyme was readily evidenced by bubbling. The volatiles produced during the reaction were continuously passed through traps held at −20° C. and −130° C. and −196° C. The −130° C. trap was found to contain stibine (0.17 g, 1.4 mmol, 62%). The −20° C. trap was employed to condense any tetraglyme, but at the reaction temperature of 0° C., none was observed. The −196° C. trap was found to contain a very volatile species which is believed to be a $BH_x$ containing byproduct of the reaction.

Method C: A 500 ml flask was charged with a suspension of purified $LiAlH_4$ (0.51 g, 13 mmol) in 100 ml tetraglyme and cooled to −30° C. A solution of SbCl3 (0.5 g, 2.2 mmol) in 50 ml tetraglyme was prepared in a nitrogen-filled glove box and then placed in an addition funnel. The reaction flask and the addition funnel were then connected using standard Schlenck techniques and then degassed. The reaction was begun by slowly adding the antimony solution to the cooled, stirred lithium aluminum hydride suspension. The suspension was observed to turn black with continuing addition of the antimony solution, and the evolution of a gas from the surface of the tetraglyme was readily evidenced by bubbling. The volatiles produced during the reaction were continuously passed through traps held at −20° C. and −196° C. The −196° C. trap was found to contain stibine (0.19 g, 1.7 mmol, 77%). The −20° C. trap was employed to condense any tetraglyme, but at the reaction temperature of −30° C., none was observed.

Vapor Phase FTIR: centered about 1939 cm−1 (m), 1891 cm−1 (vs), centered about 1846 cm−1 (m), 1154 cm−1 (vw), 840 cm−1 (w,sh), 820 cm−1 (m), 782 cm−1 (m).

II. Synthesis of $SbD_3$ (2): Deuterated stibine was synthesized in a fashion similar to that used in the synthesis of stibine by employing deuterated reducing agents.

Method A: A 500 ml flask was charged with a suspension of $NaBaD_4$ (0.50 g, 12 mmol) in 100 ml tetraglyme and cooled to −30° C. A solution of $SbCl_3$ (0.52 g, 2.3 mmol) in 50 ml tetraglyme was prepared in a nitrogen-filled glove box and then placed in an addition funnel. The reaction was conducted in a fashion identical to that described in method B above. The volatiles produced during the reaction were continuously passed through traps held at −20° C. and −130° C. and −196° C. The −130° C. trap was found to contain deuterated stibine (0.19 g, 1.5 mmol, 65%). The −20° C. trap was employed to condense any tetraglyme, but at the reaction temperature of −30° C., none was observed.

The −196° C. trap was found to contain a very volatile species which is believed to be a $BD_x$ containing byproduct of the reaction.

Method B: A 500 ml flask was charged with a suspension of purified $LiAlD_4$ (0.46 g, II mmol) in 100 ml tetraglyme and cooled to −30° C. A solu-tion of SbCl3 (0.49 g, 2.2 mmol) in 50 ml tetraglyme was prepared in a nitrogen-filled glove box and then placed in an addition funnel. The addition and workup of this reaction were conducted in a fashion identical to that described above for method C, except that the volatiles produced during the reaction were continuously passed through traps held at −20° C. and −196° C. only. The −196° C. trap was found to contain stibine (0.19 g, 1.7 nmol, 77%). The −20° C. trap was employed to condense any tetraglyme, but at the reaction temperature of −30° C., none was observed.

Vapor Phase FTIR: 2721 cm−1 (vw), 2683 cm−1 (w), 2647 cm−1 (vw), centered about 1399 cm−1 (s), 1356 cm−1 (vs), centered about 1320 cm−1 (s), 1138 cm−1 (w), 602 cm−1 (m,sh), 590 cm−1 (s), 557 cm−1 (s).

EXAMPLE I

The thermal stability of $SbD_3$ was compared to that of $SbH_3$ by storing equivalent amounts of the respective gases in glass containers of identical volume. In a kinetic study that used a 10 Torr total pressure of both $SbH_3$ and $SbD_3$ in 250 ml glass storage flasks, the improved stability of $SbD_3$ over $SbH_3$ at room temperature was clearly demonstrated. The total pressure of $SbH_3$ increased as a function of time, while $SbD_3$ in the identical container exhibited no change as a function of time. After three days of storage at 10 Torr, all of the $SbH_3$ decomposed, as confirmed by the visual observation of antimony metal deposits, the presence of a non-condensable gas at −196° C. (i.e., $H_2$) and the absence of Sb-H stretching in the vapor phase FTIR. When examining $SbD_3$, no change was observed in the total pressure as measured by a capacitance manometer. In fact, it was not possible to observe any decomposition in the $SbD_3$ experiment even after one week at room temperature (23° C.). Studies conducted in glass under similar conditions indicate that the critical pressure for the decomposition of $SbD_3$ lies between 10 and 20 Torr (250 ml volume). Slow, but continuous, decomposition was observed over a period of days for $SbH_3$ pressures above 20 Torr. Rapid and complete decomposition was observed for storage pressures of 300 Torr or greater.

At first, the low critical storage pressure of $SbD_3$ at room temperature would appear to present a problem for the storage of large quantities of this precursor. However, by holding the $SbD_3$ in a storage and dispensing vessel containing a sorbent material having sorptive affinity for the $SbD_3$, consistent with the teachings of U.S. Pat. No. 5,518,528 issued May 21, 1996 in the names of Glenn M. Tom and James V. McManus, it has proven possible to store $SbD_3$ with weight loadings in excess of 30 weight percent.

Under these storage vessel conditions, multiple gram quantities of $SbD_3$ have been stored at room temperature (23° C.) for periods of up to two weeks with little decomposition. Furthermore, after room temperature storage for two weeks, it was possible to recover >70% of the originally adsorbed $SbD_3$. The improved thermal stability of $SbD_3$ and adsorbant storage methodology make $SbD_3$ a viable and attractive precursor for the low temperature CVD of antimonide thin-films.

EXAMPLE II $SbD_3$ was thermally decomposed in a horizontal, hot-walled, low pressure CVD reactor. The precursor was introduced both neat and in diluted mixtures with H2 to yield thin-films of antimony at temperatures as low as 200° C. Typical deposition run times were fifteen minutes to one hour and resulted in thick films of pure antimony. Films were deposited onto glass (pyrex), quartz, Si and Pt over-coated silicon wafers. Good adhesion was observed on Pt/Si and glass, but the films were easily removed from Si and $SiO_2$ substrates. Films of several microns thickness were observed to readily delaminate from all substrates, except for Pt/Si. The excellent adhesion observed for Pt/Si substrates may result of the formation of alloys of platinum with antimony. In fact, XRD analysis of the samples on Pt/Si revealed the presence of Geversite Pt, $PtSb_2$ $Sb_2$. No impurities were noted from this or electron diffraction spectroscopic (EDS) analysis.

Utilizing a −196° C. cold trap, attempts to trap decomposition byproducts revealed the presence of a non-condensable gas (presumably $D_2$) and unreacted $SbD_3$. The amount of $SbD_3$ consumed during CVD at 300° C. was estimated by recovering unreacted $SbD_3$ from a 1:40 mixture of $SbD_3$ in $H_2$. Analysis indicates that $SbD_3$ conversion approached 50% efficiency under these reactor conditions. This decomposition efficiency is extraordinarily high and clearly demonstrates the utility of $SbD_3$ for the low temperature, low-cost deposition of antimonide thin-films.

While the invention has been illustratively described herein with reference to specific features, aspects and embodiments, it will be appreciated that the invention is not thus limited, but rather extends to and encompasses numerous variations, modifications and other embodiments. The invention therefore is to be correspondingly broadly construed consistent with the claims hereinafter set forth.

What is claimed is:

1. A metal hydride derivative wherein at least one hydrogen atom is replaced by deuterium ($^2_1H$) or tritium ($^3_1H$) isotope, wherein the metal of said metal hydride derivative is selected from the group consisting of: Sc, Y, Ti, Zr, V, Nb, Hf, Ta, Al, Ga, Ge, In, Sb, Tl, Pb, Bi, Cr, Mn, Fe, Co, Ni, Cu, Zn, Mo, Tc, Ru, Rh, Pd, Ag, Cd, W, Re, Os, Ir, Pt, Au, and Hg, subject to the provisos that: when the metal is Sb, said metal hydride derivative is selected from the group consisting of (i) $Sb(^3_1H)_3$, (ii) $SbH(^3_1H)_2$, and (iii) $SbH_2(^3_1H)$; and when the metal is Ge, said metal hydride derivative is selected from the group consisting of (i) $GeH_2(^2_1H)_2$, (ii) $GeH_3(^2_1H)$, (iii) $Ge(^3_1H)_4$, (iv) $GeH(^3_1H)_3$, (v) $GeH_2(^3_1H)_2$ and (vi) $GeH_3(^3_1H)$.

2. A metal hydride derivative according to claim 1, including a metal constituent selected from the group consisting of antimony, aluminum, indium, gallium, and germanium.

3. A metal hydride derivative according to claim 1, wherein the metal of said metal hydride derivative is Sb.

4. A metal hydride derivative of the formula $MY_n$ wherein M is an n-valent metal selected from-the group consisting of: Sc, Y, Ti, Zr, V, Nb, Hf, Ta, Al, Ga, Ge, In, Sb, Tl, Pb, Bi, Cr, Mn, Fe, Co, Ni, Cu, Zn, Mo, Tc, Ru, Rh, Pd, Ag, Cd, W, Re, Os, Ir, Pt, Au, and Hg, each Y is independently selected from the group consisting of hydrogen, deuterium ($^2_1H$) isotope, tritium ($^3_1H$) isotope, and halo, n is at least 2, with the provisos that: at least one Y constituent is either deuterium ($^2_1H$) isotope or tritium ($^3_1H$) isotope; when the metal is Sb, said metal hydride derivative is selected from the group consisting of (i) $SbH_2(^2_1H)$, (ii) $SbH(^2_1H)_2$, (iii) $Sb(^3_1H)_3$, (iv) $SbH(^3_1H)_2$, and (v) $SbH_2(^3_1H)$; and when the metal is Ge, said metal hydride derivative is selected from the group consisting of (i) $GeH_2(^2_1H)_2$, (ii) $GeH_3(^2_1H)$, (iii) $Ge(^3_1H)_4$, (iv) $GeH(^3_1H)_3$, (v) $GeH_2(^3_1H)_2$ and (vi) $GeH_3(^3_1H)$.

5. A metal hydride derivative according to claim 4, wherein n is from two to six, inclusive.

6. A metal hydride derivative of the formula:

$$Y_xMR_y$$

wherein:

M is a z-valent metal selected from the group consisting of: Sc, Y, Ti, Zr, V, Nb, Hf, Ta, Al, Ga, Ge, In, Sb, Sn, Tl, Pb, Bi, Cr, Mn, Fe, Co, Ni, Cu, Zn, Mo, Tc, Ru, Rh, Pd, Ag, Cd, W, Re, Os, Ir, Pt, Au, and Hg;

each Y is independently selected from the group consisting of hydrogen, deuterium ($^2_1H$) isotope and tritium ($^3_1H$) isotope;

R is independently selected from the group consisting of $C_1$–$C_8$ alkyl, $C_1$–$C_8$ perfluoroalkyl, $C_1$–$C_8$ haloalkyl, $C_6$–$C_{10}$ aryl, $C_6$–$C_{10}$ perfluoroaryl, $C_6$–$C_{10}$ haloaryl, $C_6$–$C_{10}$ cycloalkyl, substituted $C_6$–$C_{10}$ aryl and halo;

x is at least one;

x+y=z;

with the provisos that: at least one Y is either deuterium ($^2_1H$) isotope or tritium ($3_1H$) isotope; when y is zero and the metal is Sb, said metal hydride derivative is selected from the group consisting of (i) $Sb(^3_1H)_3$, (ii) $SbH(^3_1H)_2$, and (iii) $SbH_2(^3_1H)$; when y is 1 or 2, and the metal is Sb, R is not $C_1$–$C_8$ alkyl; when y is zero and the metal is Ge, said metal hydride derivative is selected from the group consisting of (i) $GeH_2(^2_1H)_2$, (ii) $GeH_3(^2_1H)$, (iii) $Ge(^3_1H)_4$, (iv) $GeH(^3_1H)_3$, (v) $GeH_2(^3_1H)_2$ and (vi) $GeH_3(^3_1H)$; and when the metal is Sn, y is at least one.

7. A metal hydride derivative according to claim 6, wherein at least one Y is deuterium ($^2_1H$) isotope.

8. A metal hydride derivative according to claim 6, containing at least two deuterium ($^2_1H$) isotope constituents.

9. A metal hydride derivative according to claim 6, wherein M is Sb, Al or In.

10. A metal hydride derivative of the formula:

$$Y_xMR_y$$

wherein:

M is a z-valent metal selected from the group consisting of: Sc, Y, Ti, Zr, V, Nb, Hf, Ta, Al, Ga, Ge, In, Sb, Sn, Tl, Pb, Bi, Cr, Mn, Fe, Co, Ni, Cu, Zn, Mo, Tc, Ru, Rh, Pd, Ag, Cd, W, Re, Os, Ir, Pt, Au, and Hg;

each Y is independently selected from the group consisting of hydrogen, deuterium ($^2_1H$) isotope and tritium ($^3_1H$) isotope;

R is independently selected from the group consisting of $C_1$–$C_8$ alkyl, $C_1$–$C_8$ perfluoroalkyl, $C_1$–$C_8$ haloalkyl, $C_6$–$C_{10}$ aryl, $C_6$–$C_{10}$ perfluoroaryl, $C_6$–$C_{10}$ haloaryl, $C_6$–$C_{10}$ cycloalkyl, substituted $C_6$–$C_{10}$ aryl and halo;

x is at least one;

x+y=z;

wherein at least one Y is tritium ($^3_1H$) isotope.

11. A deuterated composition selected from the group consisting of deuterated gallium, $Ga(^2_1H)_3$, deuterated indium, $In(^2_1H)_3$ or $In(^2_1H)_3$•L, and deuterated aluminum, $Al(^2_1H)_3$ or $Al(^2_1H)_3$ •L, wherein L is a Lewis base.

12. A deuterated composition according to claim 11, wherein the Lewis base is selected from the group consisting of glymes, tetraglymes, and polyamines.

13. A metal hydride derivative compound wherein at least one hydrogen atom is replaced by tritium ($^3_1H$).

14. A metal hydride derivative compound according to claim 13, wherein the metal of said metal hydride derivative compound is selected from the group consisting of: Sc, Y, Ti, Zr, V, Nb, Hf, Ta, Al, Ga, Ge, In, Sb, Sn, Tl, Pb, Bi, Cr, Mn, Fe, Co, Ni, Cu, Zn, Mo, Tc, Ru, Rh, Pd, Ag, Cd, W, Re, Os, Ir, Pt, Au, and Hg.

15. An antimony hydride derivative of the formula:

$$Y_xSbR_y$$

wherein:
  each Y is independently selected from the group consisting of hydrogen, deuterium ($^2_1H$) isotope and tritium ($^3_1H$) isotope;
  R is independently selected from the group consisting of $C_1$–$C_8$ alkyl, $C_1$–$C_8$ perfluoroalkyl, $C_1$–$C_8$ haloalkyl, $C_6$–$C_{10}$ aryl, $C_6$–$C_{10}$ perfluoroaryl, $C_6$–$C_{10}$ haloaryl, $C_6$–$C_{10}$ cycloalkyl, substituted $C_6$–$C_{10}$ aryl and halo;
  x is at least one;
  y is at least one;
  x+y=3;
  with the proviso at least one Y is tritium ($^3_1H$) isotope.

* * * * *

UNITED STATES PATENT AND TRADEMARK OFFICE
CERTIFICATE OF CORRECTION

PATENT NO : 6,146,608
DATED : Nov. 14, 2000
INVENTOR(S) : Michael A. Todd, Thomas H. Haum, Gautam Bhandari It is certified that error appears in the above-identified patent and that said Letters Patent are hereby corrected as shown below:

Column 1, line 41 change ' $II_2 SbR$" to -- $H_2 Sb R$ --.

Column 3, line 24 change "atritium" to -- tritium --.

Column 3, line 27 change "2 1H" to -- $^2_1H$ --.

Column 3, line 46 change "x+y z" to -- x+y=z --.

Column 11, line 62 change " $(^3_1II)_3,$ (v) $GeII_2(^3_1II)_2$ and (vi)$GeII_3(^3_1II)$." to -- $(^3_1H)_3,$ (v) $GeH_2(^3_1H)_2$ and (vi) $GeH_3(^3_1H)$. --

Signed and Sealed this

Eighth Day of May, 2001

Attest:

NICHOLAS P. GODICI

*Attesting Officer*     *Acting Director of the United States Patent and Trademark Office*